United States Patent
Dao et al.

(10) Patent No.: US 9,513,987 B2
(45) Date of Patent: Dec. 6, 2016

(54) USING ERROR CORRECTING CODES FOR PARITY PURPOSES

(71) Applicant: International Business Machines Corporation, Armonk, NY (US)

(72) Inventors: Son T. Dao, Stuttgart (DE); Juergen Haess, Schoenaich (DE); Michael Klein, Schoenaich (DE); Silvia M. Mueller, Altdorf (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/535,899

(22) Filed: Nov. 7, 2014

(65) Prior Publication Data

US 2016/0132390 A1     May 12, 2016

(51) Int. Cl.
    *G06F 11/10*      (2006.01)
    *G06F 3/06*      (2006.01)
    (Continued)

(52) U.S. Cl.
    CPC .............. *G06F 11/10* (2013.01); *G06F 3/064* (2013.01); *G06F 3/0619* (2013.01); *G06F 3/0673* (2013.01); *G06F 11/1076* (2013.01); *H03M 13/098* (2013.01); *H03M 13/13* (2013.01); *H03M 13/35* (2013.01); *G06F 11/0751* (2013.01); *G06F 11/1012* (2013.01); *G06F 11/1032* (2013.01); *G06F 11/1044* (2013.01); *G06F 11/1048* (2013.01);
(Continued)

(58) Field of Classification Search
CPC ... G06F 11/1044; G06F 11/10; G06F 11/1048; G06F 3/0619; G06F 11/1032; G06F 11/0751; G06F 11/1012; H04L 1/0057; H04L 49/557; G11C 29/42; G11B 20/1803; H03M 13/19; H03M 13/09
USPC .................. 714/E11.032, 764, 777, 785, 799
See application file for complete search history.

(56) References Cited

U.S. PATENT DOCUMENTS 8,069,392 B1 * 11/2011 Norrie .................. H03M 13/033
                                                                             714/758
8,327,249 B2     12/2012 Jorda et al.
(Continued)

OTHER PUBLICATIONS

Manoochehri et al., "Extremely Low Cost Error Protection with Correctable Parity Protected Cache", IEEE Transactions on Computers, DOI: 10.1109/TC.2013.117, May 22, 2013, pp. 1-14.
(Continued)

*Primary Examiner* — Cynthia Britt
*Assistant Examiner* — Sazzad Hossain
(74) *Attorney, Agent, or Firm* — William H. Hartwell (57) ABSTRACT

Software that combines parity bits with error correcting codes (ECC) such that a subset of ECC bits is also used for parity purposes, by performing the following steps: (i) providing a first set of redundant bit(s) in a data block, where the first set of redundant bit(s) is adapted to detect and/or correct errors in the data block; (ii) providing, within the first set of redundant bit(s), a first sub-set of parity bit(s), where the first sub-set of parity bit(s) is adapted to provide single bit error detection for the data block; and (iii) determining, based, at least in part, on a first set of data read requirements, whether to use the first set of redundant bit(s) and/or the first sub-set of parity bit(s) to detect and/or correct potential errors while reading data on the data block.

10 Claims, 4 Drawing Sheets

(51) Int. Cl.

| | | |
|---|---|---|
| *H03M 13/13* | (2006.01) | |
| *H03M 13/35* | (2006.01) | |
| *G06F 11/07* | (2006.01) | |
| *H04L 1/00* | (2006.01) | |
| *G11B 20/18* | (2006.01) | |
| *H03M 13/09* | (2006.01) | |
| *G11C 29/42* | (2006.01) | |
| *H04L 12/939* | (2013.01) | |
| *H03M 13/19* | (2006.01) | |
| *H03M 13/11* | (2006.01) | |
| *H03M 13/15* | (2006.01) | |

(52) U.S. Cl.
CPC .......... *G11B 20/1803* (2013.01); *G11C 29/42* (2013.01); *H03M 13/09* (2013.01); *H03M 13/1102* (2013.01); *H03M 13/152* (2013.01); *H03M 13/1515* (2013.01); *H03M 13/19* (2013.01); *H04L 1/0057* (2013.01); *H04L 49/557* (2013.01)

(56) References Cited

U.S. PATENT DOCUMENTS

| | | | |
|---|---|---|---|
| 8,468,416 B2 | 6/2013 | Gara et al. | |
| 8,510,641 B2 | 8/2013 | Jones, Jr. | |
| 8,645,789 B2 | 2/2014 | Sharon et al. | |
| 2004/0163027 A1* | 8/2004 | MacLaren | G06F 11/108 714/764 |
| 2006/0020873 A1* | 1/2006 | Deolalikar | H03M 13/19 714/777 |
| 2006/0136800 A1* | 6/2006 | Kawabata | G06F 11/1012 714/763 |
| 2006/0168494 A1* | 7/2006 | Trainin | H03M 13/2915 714/758 |
| 2007/0113158 A1* | 5/2007 | Fischer | G11C 15/00 714/777 |
| 2010/0251036 A1* | 9/2010 | Moyer | G06F 11/1064 714/53 |
| 2012/0110411 A1 | 5/2012 | Cheung et al. | |
| 2013/0159809 A1 | 6/2013 | Aldereguia et al. | |
| 2015/0082118 A1* | 3/2015 | Jeong | H03M 13/1165 714/758 |

OTHER PUBLICATIONS

Reviriego et al., "Reducing the Cost of Single Error Correction With Parity Sharing", IEEE Transactions on Device and Materials Reliability, vol. 13, No. 3, Sep. 2013, pp. 420-422.

Appendix P—List of IBM Patents or Patent Applications Treated as Related.

U.S. Appl. No. 14/576,403, entitled "Using Error Correcting Codes for Parity Purposes", filed Dec. 19, 2014.

\* cited by examiner

USING ERROR CORRECTING CODES FOR PARITY PURPOSES

BACKGROUND OF THE INVENTION

The present invention relates generally to the field of error control, and more particularly to the field of error detecting and correcting codes.

Error control is known. Error control is the detection and/or correction of data errors to ensure reliable data storage and/or delivery. Errors can occur due to a number of reasons, including, for example, unreliable storage hardware, unreliable communication channels, and/or channel noise such as background radiation. Error detection allows for the detecting of such errors, while error correction enables reconstruction of the original data to correct the errors.

One known error control scheme is the use of parity bits. A parity bit is a bit that is added to a group of source bits to ensure that the number of set bits (that is, bits with value 1) in the outcome is even or odd. Parity bits can be used to detect one or any other odd number (for example, three, five, etc.) of errors in the output. However, an even number of error-including bits will make the parity bit appear correct even though the data is erroneous. Parity bits are typically used in situations where an operation can be repeated in case of difficulty, where simply detecting the error is helpful.

Another known error control scheme is the use of error-correcting codes (or ECC). ECC are groups of bits that are added to source bits and are usable for both error detection and error correction. ECC typically accomplish error detection and correction by adding redundancy to the source bits using an algorithm. The redundant bits in ECC may, for example, be a complex function of many original source bits. ECC are commonly used in computers where data corruption cannot be tolerated under any circumstances, such as, for example, scientific or financial computing.

SUMMARY

According to an aspect of the present invention, there is a method, computer program product and/or system that performs the following steps (not necessarily in the following order): (i) providing a first set of redundant bit(s) in a data block, where the first set of redundant bit(s) is adapted to detect and/or correct errors in the data block; (ii) providing, within the first set of redundant bit(s), a first sub-set of parity bit(s), where the first sub-set of parity bit(s) is adapted to provide single bit error detection for the data block; and (iii) determining, based, at least in part, on a first set of data read requirements, whether to use the first set of redundant bit(s) and/or the first sub-set of parity bit(s) to detect and/or correct potential errors while reading data on the data block.

DETAILED DESCRIPTION

In error control, parity bits allow for the detection of single-bit errors in a data block, while error correction codes (ECC) are typically designed to detect (and many times, correct) larger bit errors. Some embodiments of the present invention combine parity bits with ECC such that a subset of ECC bits is also used for parity purposes. This enables single-bit error detection via parity bits while also providing additional error detection/correction via ECC code bits, as needed. This Detailed Description section is divided into the following sub-sections: (i) The Hardware and Software Environment; (ii) Example Embodiment; (iii) Further Comments and/or Embodiments; and (iv) Definitions.

I. THE HARDWARE AND SOFTWARE ENVIRONMENT

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 1:
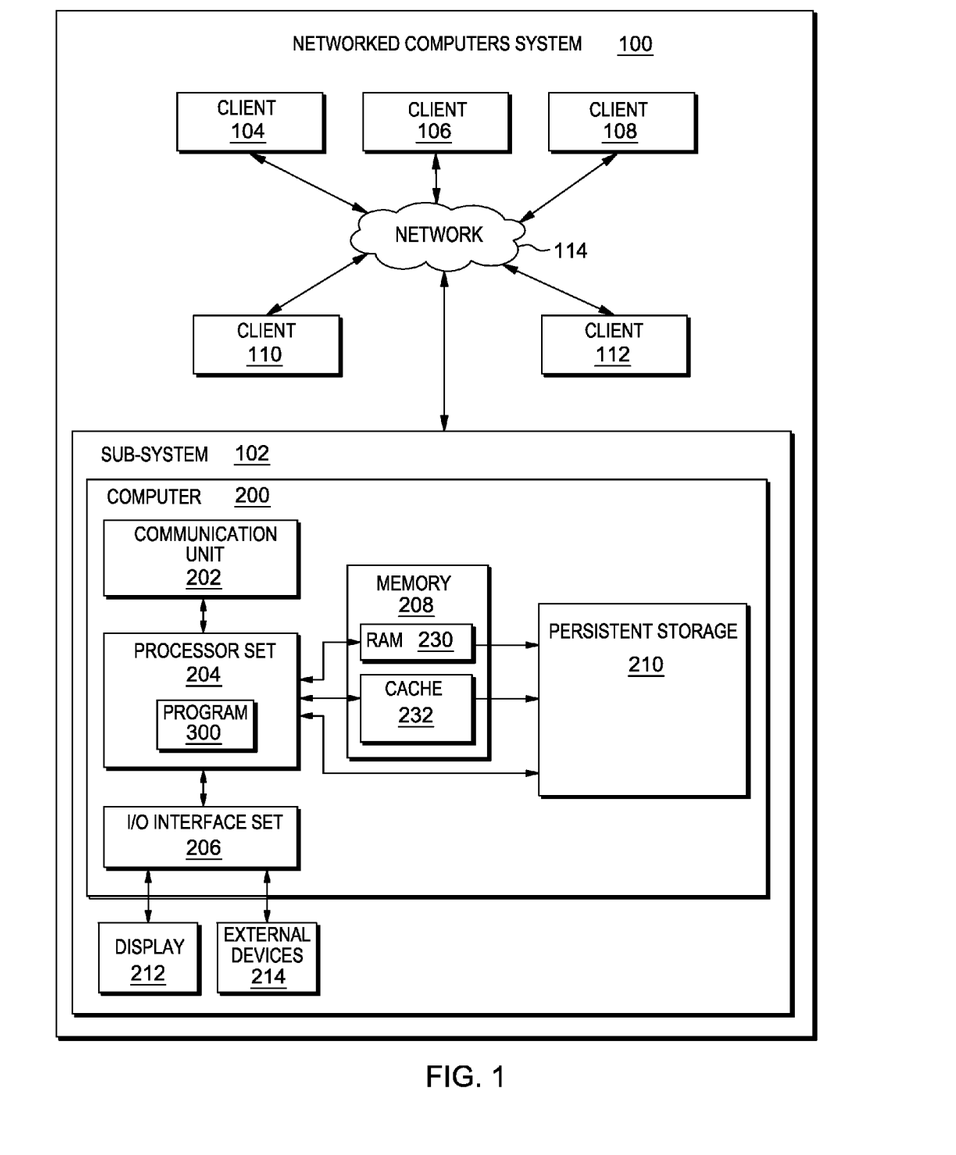
FIG. 1 is a block diagram view of a first embodiment of a system according to the present invention.

An embodiment of a possible hardware and software environment for software and/or methods according to the present invention will now be described in detail with reference to the Figures. FIG. 1 is a functional block diagram illustrating various portions of networked computers system 100, including: sub-system 102; client sub-systems 104, 106, 108, 110, 112; communication network 114; computer 200; communication unit 202; processor set 204; input/output (I/O) interface set 206; memory device 208; persistent storage device 210; display device 212; external device set 214; random access memory (RAM) devices 230; cache memory device 232; and program 300.

Sub-system 102 is, in many respects, representative of the various computer sub-system(s) in the present invention. Accordingly, several portions of sub-system 102 will now be discussed in the following paragraphs.

Sub-system 102 may be a laptop computer, tablet computer, netbook computer, personal computer (PC), a desktop computer, a personal digital assistant (PDA), a smart phone, or any programmable electronic device capable of communicating with the client sub-systems via network 114. Program 300 is a collection of machine readable instructions and/or data that is used to create, manage and control certain software functions that will be discussed in detail, below, in the Example Embodiment sub-section of this Detailed Description section.

Sub-system 102 is capable of communicating with other computer sub-systems via network 114. Network 114 can be, for example, a local area network (LAN), a wide area network (WAN) such as the Internet, or a combination of the two, and can include wired, wireless, or fiber optic connections. In general, network 114 can be any combination of connections and protocols that will support communications between server and client sub-systems.

Sub-system 102 is shown as a block diagram with many double arrows. These double arrows (no separate reference numerals) represent a communications fabric, which provides communications between various components of sub-system 102. This communications fabric can be implemented with any architecture designed for passing data and/or control information between processors (such as microprocessors, communications and network processors, etc.), system memory, peripheral devices, and any other hardware components within a system. For example, the communications fabric can be implemented, at least in part, with one or more buses.

Memory 208 and persistent storage 210 are computer-readable storage media. In general, memory 208 can include any suitable volatile or non-volatile computer-readable storage media. It is further noted that, now and/or in the near future: (i) external device(s) 214 may be able to supply, some or all, memory for sub-system 102; and/or (ii) devices external to sub-system 102 may be able to provide memory for sub-system 102.

Program 300 is stored in processor set 204. Alternatively, program 300 may be located in persistent storage 210 for access and/or execution by one or more of the respective computer processors 204, usually through one or more memories of memory 208. Persistent storage 210: (i) is at least more persistent than a signal in transit; (ii) stores the program (including its soft logic and/or data), on a tangible medium (such as magnetic or optical domains); and (iii) is substantially less persistent than permanent storage. Alternatively, data storage may be more persistent and/or permanent than the type of storage provided by persistent storage 210.

Program 300 may include both machine readable and performable instructions and/or substantive data (that is, the type of data stored in a database). In this particular embodiment, persistent storage 210 includes a magnetic hard disk drive. To name some possible variations, persistent storage 210 may include a solid state hard drive, a semiconductor storage device, read-only memory (ROM), erasable programmable read-only memory (EPROM), flash memory, or any other computer-readable storage media that is capable of storing program instructions or digital information.

The media used by persistent storage 210 may also be removable. For example, a removable hard drive may be used for persistent storage 210. Other examples include optical and magnetic disks, thumb drives, and smart cards that are inserted into a drive for transfer onto another computer-readable storage medium that is also part of persistent storage 210.

Communications unit 202, in these examples, provides for communications with other data processing systems or devices external to sub-system 102. In these examples, communications unit 202 includes one or more network interface cards. Communications unit 202 may provide communications through the use of either or both physical and wireless communications links. Any software modules discussed herein may be downloaded to a persistent storage device (such as persistent storage device 210) through a communications unit (such as communications unit 202).

I/O interface set 206 allows for input and output of data with other devices that may be connected locally in data communication with server computer 200. For example, I/O interface set 206 provides a connection to external device set 214. External device set 214 will typically include devices such as a keyboard, keypad, a touch screen, and/or some other suitable input device. External device set 214 can also include portable computer-readable storage media such as, for example, thumb drives, portable optical or magnetic disks, and memory cards. Software and data used to practice embodiments of the present invention, for example, program 300, can be stored on such portable computer-readable storage media. In these embodiments the relevant software may (or may not) be loaded, in whole or in part, onto persistent storage device 210 via I/O interface set 206. I/O interface set 206 also connects in data communication with display device 212.

Display device 212 provides a mechanism to display data to a user and may be, for example, a computer monitor or a smart phone display screen.

The programs described herein are identified based upon the application for which they are implemented in a specific embodiment of the invention. However, it should be appreciated that any particular program nomenclature herein is used merely for convenience, and thus the invention should not be limited to use solely in any specific application identified and/or implied by such nomenclature.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the invention. The terminology used herein was chosen to best explain the principles of the embodiment, the practical application or technical improvement over technologies found in the marketplace, or to enable others of ordinary skill in the art to understand the embodiments disclosed herein.

II. EXAMPLE EMBODIMENT

Figure 2:
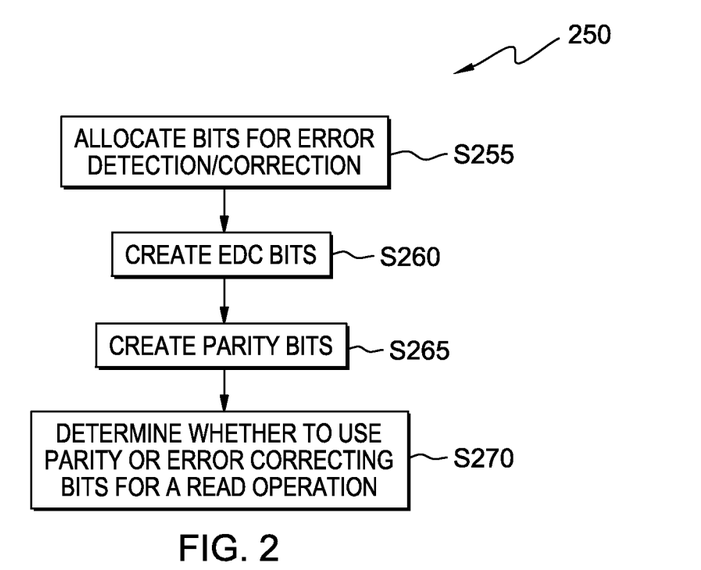
FIG. 2 is a flowchart showing a first embodiment method performed, at least in part, by the first embodiment system.
Figure 3:
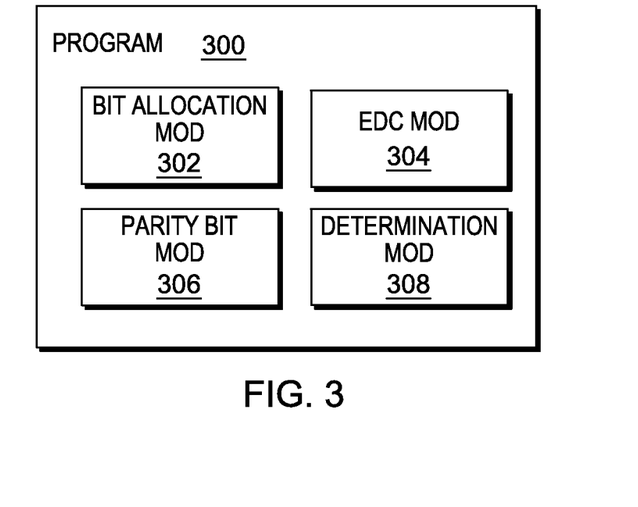
FIG. 3 is a block diagram view of a machine logic (for example, software) portion of the first embodiment system.

FIG. 2 shows flowchart 250 depicting a method according to the present invention. FIG. 3 shows program 300 for performing at least some of the method steps of flowchart 250. This method and associated software will now be discussed, over the course of the following paragraphs, with extensive reference to FIG. 2 (for the method step blocks) and FIG. 3 (for the software blocks).

The following paragraphs refer extensively to bits of data contained within data blocks. As used herein, a data block (or "block") is simply meant to be a sequence of one or more bits that may be read or written as a group. In some embodiments, for example, a block may be equal to a byte (eight bits) of data. In other embodiments, a block may be equal to sixty four bits of data. However, this is not meant to be limiting, and embodiments of the present invention may include data blocks of varying lengths and configurations.

Processing begins at step S255, where bit allocation module ("mod") 302 (see FIG. 3) allocates bits in a data block for error detection and/or correction (see FIG. 2). As a result, the data block is divided into two portions: (i) a payload portion; and (ii) an error detection/correction (EDC) portion. The payload portion includes the original source bits (the "payload bits") meant to be stored or transmitted, while the EDC portion (also referred to as the "EDC code" and/or the "data protection code") includes the newly allocated error detection and/or correction bits (also referred to as "redundant bits" and/or "EDC bits").

The data allocation that takes place during step S255 may be based on a number of factors, including, for example, desired block length, desired payload-to-EDC ratio, and/or desired EDC requirements. In many embodiments of the present invention, the EDC requirements include the number of bit errors the EDC portion is required to be able to detect and/or correct. Or, stated another way, the EDC requirements may include: (i) a minimum number of bit errors detectable by using the EDC bits and (ii) a minimum number of bit errors correctable by using the EDC bits. In these embodiments, the EDC requirements may be represented by a minimum "Hamming distance," which equals a number of bit positions that must change in the data block for the EDC portion to no longer be able to detect and/or correct errors. For further discussion of EDC requirements and Hamming distances, see the Further Comments and/or Embodiments sub-section of this Detailed Description.

A simple example embodiment is provided herein to assist in explaining aspects of the present invention. In this simplified example embodiment, a ten-bit data block is provided, with eight bits allocated to error detection and/or correction, resulting in two payload bits and eight EDC bits.

In this embodiment, the payload bits are "1" and "0" (or "10"), and the EDC requirements are that the EDC portion must detect and correct at least one bit error. It should be noted that this embodiment is being used for explanatory purposes, and that other embodiments may be preferred to this simple example embodiment. For a discussion of more detailed embodiments of the present invention, see the Further Comments and/or Embodiments sub-section of this Detailed Description.

Processing proceeds to step S260, where EDC mod 304 (see FIG. 3) creates EDC bits (see FIG. 2) by setting the bits of the EDC portion of the data block to redundantly store enough information about the payload portion to be able to detect and/or correct errors in the payload portion. Many known (or to be known in the future) error correcting codes (ECC) may be used for the EDC bits, including, for example: cyclic redundancy check codes, Reed-Solomon codes, Hamming codes, low-density parity-check codes, checksums, cryptographic hash functions, and/or repetition codes. However, this is not meant to be limiting, and the EDC portion may include any configuration of bits that are adapted to detect and/or correct errors in the payload portion. For example, in one embodiment, the EDC portion may be constructed using P unique (M−2)-tuples, where P equals a parity bit chunk length and M equals a minimum Hamming distance. For a detailed discussion of this embodiment and of EDC bits, see: (i) the Further Comments and/or Embodiments sub-section of this Detailed Description; and (ii) the Definitions sub-section of this Detailed Description.

In the present example embodiment, the EDC bits are created using a simple repetition code: for each bit in the payload portion, the bit is repeated four additional times in the EDC portion. The first four EDC bits repeat the first payload bit, and the second four (and last four) EDC bits repeat the second payload bit. Therefore, the resulting EDC portion is "11110000" (with the entire data block being "1011110000"). In this embodiment, errors can be detected by looking for differences between the payload bits and their corresponding EDC bits (if any bit is different from the others, there is an error). Additionally, errors can be corrected by replacing error bits with the value of the prevalent bit in their corresponding payload bit/EDC bit combination. For example, if the first payload bit is a "0" and its corresponding EDC bits are "1111", then the "0" would be replaced by "1", which is the more prevalent bit.

Processing proceeds to step S265, where parity bit mod 306 (see FIG. 3) creates parity bits from one or more of the existing EDC bits (see FIG. 2). In other words, in this step, mod 306 selects a subset of the EDC bits and uses them for parity purposes. Any known (or to be known in the future) parity bit method for providing single bit error detection may be used, such as even bit parity or odd bit parity. For further discussion of parity bits, see: (i) the Further Comments and/or Embodiments sub-section of this Detailed Description; and (ii) the Definitions sub-section of this Detailed Description.

In the present example embodiment, method 250 uses even bit parity for step S265, such that the parity bit is a "1" if the payload portion contains an odd number of "1"s and the parity bit is "0" if the payload portion contains zero "1"s or an even number of "1"s. In terms of location, in the present example embodiment the parity bit is located in the final bit in the EDC portion. As a result (and because the payload portion contains an odd number of "1"s), step S265 transforms the original EDC portion of "11110000" into "11110001" (with a resulting data block of "1011110001").

It should be noted that in many embodiments of the present invention, the process of replacing some existing EDC bits with parity bits should not render the EDC bits ineffective in their purpose of detecting and/or correcting errors in payload bits. Instead, the result of step S265 should be EDC bits that are capable of detecting and/or correcting errors and a sub-set of parity bits that are capable of detecting single bit errors. In the present example embodiment, for example, the EDC portion still functions on its own as an EDC, despite the fact that the final bit has been changed from a zero to a one. In the present embodiment, this is due to additional redundancy provided by the EDC bits. However, in other embodiments (such as those discussed below in the Further Comments and/or Embodiments sub-section of this Detailed Description), the error detecting/correcting properties of the EDC portion may be preserved in other ways.

Processing proceeds to step S270, where determination mod 308 determines whether to use the parity bits or the EDC bits for a given read operation, based, at least in part, on a set of data read requirements. The data read requirements may include, for example: (i) the level of error detection needed; (ii) the level of error correction needed; and/or (iii) whether error correction is needed at all. Furthermore, the data read requirements may be based on a number of factors, such as, for example, the circumstances behind the given read operation and/or the type of data contained in the data block. In some embodiments, for example, the data read requirements may include the checking of variable length operands and/or byte shifts. In the present example embodiment, the data is read following a data transfer from one computer to another computer. In this embodiment, to minimize the number of processor cycles involved in the read operation, mod 308 chooses to use the parity bits for error detection. If no error is detected, processing for method 250 completes. However, if an error is detected, mod 308 may choose to re-read the data block using the EDC bits to correct the error. Alternatively, mod 308 may request that the data be re-sent from the source computer.

III. FURTHER COMMENTS AND/OR EMBODIMENTS

Some embodiments of the present invention recognize the following facts, potential problems and/or potential areas for improvement with respect to the current state of the art: (i) many existing error control solutions rely on parity bits or error correcting codes (ECC), but not both; (ii) existing parity-based solutions only allow for single-bit error detection, and do not allow for multi-bit error detection and/or error correction; (iii) existing ECC-based solutions can be very resource-expensive for short data chunks (for example, byte chunks); (iv) existing ECC-based solutions can be complicated and/or expensive to generate; and/or (v) using both parity and ECC in combination typically requires more bits than desired.

Some embodiments of the present invention may include one, or more, of the following features, characteristics and/or advantages: (i) generating a data protection code (DPC) with two bit error detection and one bit error correction; (ii) providing parity protection of byte chunks to support quick data transfer checking, byte shifts, and variable length operands; and/or (iii) providing both data transfer protection and long term storage protection with a limited area (or bit) budget.

Many embodiments of the present invention utilize a DPC (also referred to as the "EDC portion" and/or "EDC bits") that is divided into two groups of bits: (i) a first group that is generated in the same way as parity bits; and (ii) a second group that is generated such that the complete DPC meets error detection/correction requirements in the same way as an ECC. The DPC of these embodiments is adapted to minimize space expense and reduce build complication. For example, an existing approach of using both parity and ECC (the current state of the art) will result in 17 bits of parity/ECC for one bit error correction and two bit error detection on an 8 byte (64 bit) word. The DPC of the present invention, however, only requires 13 bits for the same amount of data and error detection/correction requirements (8 bits in the first group and 5 bits in the second group).

In many embodiments of the present invention, the first group (also referred to as the "parity group" or "parity bits") is adapted to be used in situations where parity bits are sufficient (such as, for example, operand transfer). Additionally, in these embodiments, parity checking is built into the DPC processing logic, thereby eliminating the need for extra parity generators.

The DPC generated and used according to the present invention is adapted to detect errors in a word in a relatively easy and inexpensive manner. In one example embodiment, an 8 byte (64 bit) word is provided. In this embodiment, the parity bits require only an 8 way XOR tree for single-bit error detection. Additionally, the second group of bits (also referred to as the "ECC group" or "ECC bits") requires a less than 28 way XOR tree for two-bit error detection.

Figure 4:
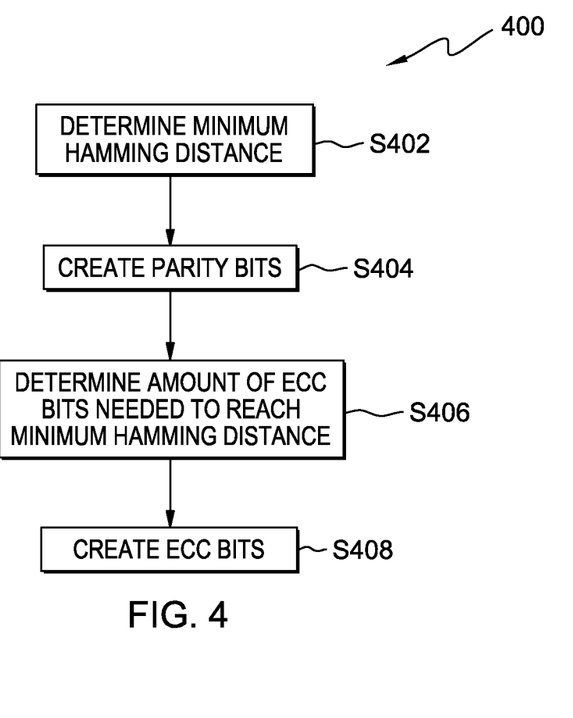
FIG. 4 is a flowchart showing a second embodiment performed, at least in part, by a second embodiment system.

In one embodiment of the present invention, method 400 for creating a DPC with combined parity and ECC is provided (see FIG. 4). Method 400 includes a number of variables: (i) word length W; (ii) parity chunk length P; (iii) error correction amount C; and (iv) error detection amount D. In the present example, W equals 64 bits, P equals 8 bits, C equals 1 bit, and D equals 2 bits.

Processing begins at step S402, where method 400 determines a minimum Hamming distance for the DPC. The minimum Hamming distance represents the minimum number of bits that would have to change between the original word and an altered word (that is, a word with errors) to prevent the DPC from being able to detect the errors. The minimum Hamming distance depends on the values of C (the desired amount of error correction) and D (the desired amount of error detection). Specifically, in the present embodiment, the minimum Hamming distance (M) is represented by the equation "M=C+D+1". As such, in this embodiment, an additional bit of error detection is provided. In the present example, where C equals 1 and D equals 2, M equals 4.

Processing proceeds to step S404, where method 400 creates the parity bits (or the "first group") for the DPC. This step is performed using known methods for creating parity bits. In the present example, because the word length (W) equals 64, and the parity chunk length (P) equals 8, eight parity bits are created (one parity bit for each parity chunk in the word).

Processing then proceeds to step S406, where method 400 determines an amount of ECC bits (that is, "second group" bits) needed to reach the minimum Hamming distance (M). Because parity bits provide two bits of Hamming distance, the additional amount of Hamming distance needed can be represented by the equation "M−2" (M minus two). In the present example, M equals four bits, so M minus two equals two bits.

Continuing with step S406, when C equals one bit, method 400 determines how many bits (E) are needed to create at least P unique (M−2)-tuples. In other words, method 400 determines the number of bits (E) required to store enough (M−2)-bit groupings to protect each bit in a parity chunk. In the present example, because P equals 8 and M equals 2, 8 different 2-tuples (2-bit groupings) are needed. Or, stated another way, method 400 needs to determine how many bits are needed such that at least 8 unique groups of those bits with exactly 2 ones in them can be created. As such, 5 bits are needed (as 4 bits will only allow for 6 unique groups of bits with 2 ones in them: 0011, 0101, 0110, 1001, 1010, 1100).

Still referring to step S406, when C is greater than one, method 400 must calculate E in a different way. In many embodiments of the present invention, a balanced version of P unique (M−2)-tuples is used. For example, method 400 may use machine logic to examine all combinations of possible bit changes to ensure that the tuples selected can still meet the desired amount of error correction in C.

Once method 400 determines how many second group bits (E) are needed, processing proceeds to step S408, where E second group bits are created. The second group bits are created in any way that allows them to provide the required error detection/correction for the word to be protected. In some embodiments, a balanced version of P unique (M−2) tuples are used for the second group bits. In one embodiment, each bit in the second group bits is created by calculating a parity bit for a certain sub-set of the bits contained in the entire word. Because each bit in the second group of bits represents the parity of a different combination of bits in the word, the value of any given bit in the word may be recovered (or corrected) by performing a certain number of XOR functions on the second group bits.

Once the second group bits have been created, they are added to the first group to create the resulting EDC. In the present example, the EDC includes a total of 13 bits (8 bits in the first group and 5 bits in the second group).

Figure 5:
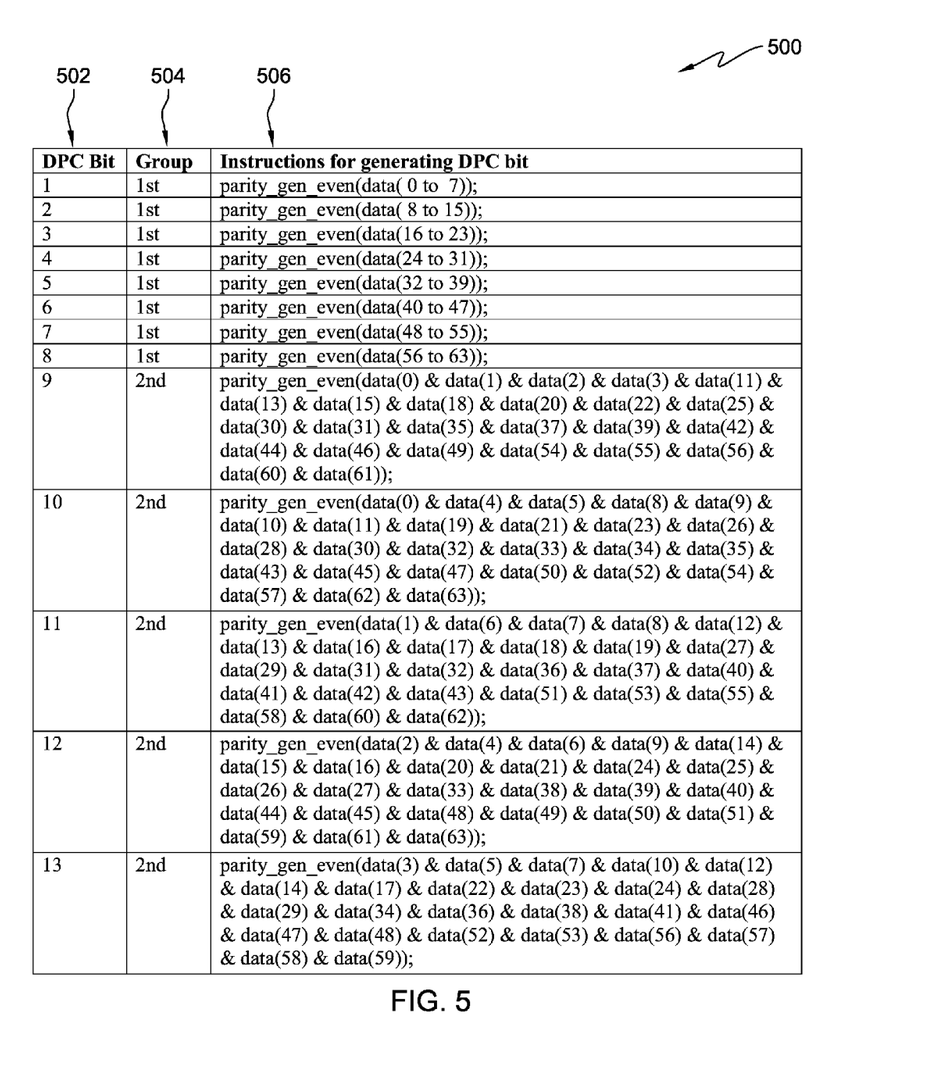
FIG. 5 is a table view showing information that is generated by and helpful in understanding embodiments of the present invention.

Table 500 (see FIG. 5) provides an example of data generated by method 400 in an embodiment of the present invention. Specifically: column 502 shows the bit number for each bit in a DPC, representing the bit's location within the DPC; column 504 shows the group that each particular bit is included in (first group or second group); and column 506 shows example program instructions for generating each DPC bit. It should be noted that the information contained in table 500 is provided for example purposes, and that method 400 may be implemented in a variety of ways of equivalent or differing feasibility.

IV. DEFINITIONS

Present invention: should not be taken as an absolute indication that the subject matter described by the term "present invention" is covered by either the claims as they are filed, or by the claims that may eventually issue after patent prosecution; while the term "present invention" is used to help the reader to get a general feel for which disclosures herein are believed to potentially be new, this understanding, as indicated by use of the term "present invention," is tentative and provisional and subject to change over the course of patent prosecution as relevant information is developed and as the claims are potentially amended.

Embodiment: see definition of "present invention" above—similar cautions apply to the term "embodiment."

and/or: inclusive or; for example, A, B "and/or" C means that at least one of A or B or C is true and applicable.

Module/Sub-Module: any set of hardware, firmware and/or software that operatively works to do some kind of function, without regard to whether the module is: (i) in a single local proximity; (ii) distributed over a wide area; (iii) in a single proximity within a larger piece of software code; (iv) located within a single piece of software code; (v) located in a single storage device, memory or medium; (vi) mechanically connected; (vii) electrically connected; and/or (viii) connected in data communication.

Computer: any device with significant data processing and/or machine readable instruction reading capabilities including, but not limited to: desktop computers, mainframe computers, laptop computers, field-programmable gate array (FPGA) based devices, smart phones, personal digital assistants (PDAs), body-mounted or inserted computers, embedded device style computers, application-specific integrated circuit (ASIC) based devices.

Parity bit: a bit that is added to a group of source bits to ensure, during a read operation, that the number of set bits (that is, bits with value 1) is even or odd. Parity bits are typically capable of detecting (but not correcting) one or any other odd number (for example, three, five, etc.) of errors in the source bits.

Error detection/correction (EDC) bit: any bit that, by itself, or as part of a set of bits, provides error detection/correction capabilities other than only the error detection/correction capabilities provided by a parity bit. Some sets of EDC bits, for example, provide more bits of error detection than the single bit error detection provided by parity bits, and other sets of EDC bits provide error correction in addition to detection. Examples of typical sets of EDC bits include, but are not limited to: cyclic redundancy check codes, Reed-Solomon codes, Hamming codes, low-density parity-check codes, checksums, cryptographic hash functions, and/or repetition codes.

What is claimed is:

1. A computer program product comprising a computer readable storage medium having stored thereon:
    first program instructions programmed to provide a first set of redundant bit(s) in a data block, where the first set of redundant bit(s) is adapted to detect and correct errors in the data block;
    second program instructions programmed to provide, within the first set of redundant bit(s), a first sub-set of parity bit(s), where the first sub-set of parity bit(s) is adapted to provide single bit error detection for the data block; and
    third program instructions programmed to determine, based, at least in part, on a first set of data read requirements, whether to use the first sub-set of parity bit(s) to perform single bit error detection for a read operation performed on the data block, or to use the entire first set of redundant bit(s), including the first sub-set of parity bit(s), to perform error correction or multi-bit error detection for the read operation performed on the data block, without using the first sub-set of parity bit(s) to perform single bit error detection;
    wherein the first set of redundant bit(s) is created, based, at least in part, on a first set of error detection/correction (EDC) requirements, where the EDC requirements include: (i) a minimum hamming distance representing a minimum number of bits in the data block that must change before the first set of redundant bit(s) is no longer able to detect or correct errors in the data block, and (ii) the bit(s) in the first set of redundant bit(s) that are not in the first sub-set of parity bit(s) include enough bit(s) to create at least P unique (M−2)-tuples, where P equals the number of bit(s) in the first sub-set of parity bit(s), and where M equals the minimum hamming distance.

2. The computer program product of claim 1, further comprising:
    fourth program instructions programmed to use the first set of redundant bit(s) to detect and correct one or more errors in the data block.

3. The computer program product of claim 1, further comprising:
    fourth program instructions programmed to use the first sub-set of parity bit(s) to determine whether the data block contains any single bit errors.

4. The computer program product of claim 3, further comprising:
    fifth program instructions programmed to, upon using the first sub-set of parity bit(s) to determine an error in the data block, use the first set of redundant bit(s) to correct the error.

5. The computer program product of claim 1, wherein: the EDC requirements further include: (i) a minimum number of bit errors detectable by using the first set of redundant bit(s), and (ii) a minimum number of bit errors correctable by using the first set of redundant bit(s).

6. A computer system comprising:
    a processor(s) set; and
    a computer readable storage medium;
    wherein:
    the processor set is structured, located, connected and/or programmed to run program instructions stored on the computer readable storage medium; and
    the program instructions include:
        first program instructions programmed to provide a first set of redundant bit(s) in a data block, where the first set of redundant bit(s) is adapted to detect and correct errors in the data block;
        second program instructions programmed to provide, within the first set of redundant bit(s), a first sub-set of parity bit(s), where the first sub-set of parity bit(s) is adapted to provide single bit error detection for the data block; and
        third program instructions programmed to determine, based, at least in part, on a first set of data read requirements, whether to use the first sub-set of parity bit(s) to perform single bit error detection for a read operation performed on the data block, or to use the entire first set of redundant bit(s), including the first sub-set of parity bit(s), to perform error correction or multi-bit error detection for the read operation performed on the data block, without using the first sub-set of parity bit(s) to perform single bit error detection;
        wherein the first set of redundant bit(s) is created, based, at least in part, on a first set of error detection/correction (EDC) requirements, where the EDC requirements include: (i) a minimum hamming distance representing a minimum number of bits in the data block that must change before the first set of redundant bit(s) is no longer able to detect or correct errors in the data block, and (ii) the bit(s) in the first set of redundant bit(s) that are not in the first sub-set of parity bit(s) include enough bit(s) to create at least P unique (M−2)-tuples, where P equals the number of bit(s) in the first sub-set of parity bit(s), and where M equals the minimum hamming distance.

7. The computer system of claim 6, further comprising:
fourth program instructions programmed to use the first set of redundant bit(s) to detect and correct one or more errors in the data block.

8. The computer system of claim 6, further comprising:
fourth program instructions programmed to use the first sub-set of parity bit(s) to determine whether the data block contains any single bit errors.

9. The computer system of claim 8, further comprising:
fifth program instructions programmed to, upon using the first sub-set of parity bit(s) to determine an error in the data block, use the first set of redundant bit(s) to correct the error.

10. The computer system of claim 6, wherein:
the EDC requirements further include: (i) a minimum number of bit errors detectable by using the first set of redundant bit(s), and (ii) a minimum number of bit errors correctable by using the first set of redundant bit(s).

\* \* \* \* \*